(12) United States Patent
Ishida et al.

(10) Patent No.: US 9,520,540 B2
(45) Date of Patent: Dec. 13, 2016

(54) LIGHT-EMITTING DEVICE WITH PHOSPHOR EXCITED BY BLUE EXCITATION LIGHT

(71) Applicant: Kabushiki Kaisha Toshiba, Minato-ku (JP)

(72) Inventors: Kunio Ishida, Tokyo (JP); Keiko Albessard, Kanagawa (JP); Yasushi Hattori, Kanagawa (JP); Iwao Mitsuishi, Tokyo (JP); Yumi Fukuda, Tokyo (JP); Ryosuke Hiramatsu, Kanagawa (JP); Aoi Okada, Kanagawa (JP); Masahiro Kato, Kanagawa (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 18 days.

(21) Appl. No.: 14/184,881

(22) Filed: Feb. 20, 2014

(65) Prior Publication Data

US 2014/0252391 A1    Sep. 11, 2014

(30) Foreign Application Priority Data

Mar. 7, 2013    (JP) .................................. 2013-044914

(51) Int. Cl.
*H01L 33/50* (2010.01)
*C09K 11/77* (2006.01)

(52) U.S. Cl.
CPC ......... *H01L 33/504* (2013.01); *C09K 11/7721* (2013.01); *C09K 11/7734* (2013.01); *H01L 33/502* (2013.01)

(58) Field of Classification Search
CPC ...... H01L 33/00; H01L 33/504; H01L 33/502; C09K 11/7721; C09K 11/7734
(Continued)

(56) References Cited

U.S. PATENT DOCUMENTS

2009/0236963 A1    9/2009  Nagatomi et al.
2009/0309112 A1*   12/2009 Yoshimatsu ....... C09K 11/0883
                                                    257/98
(Continued)

FOREIGN PATENT DOCUMENTS

EP    1 867 697 A1    12/2007
EP    1 964 906 A1     9/2008
(Continued)

OTHER PUBLICATIONS

Office Action issued on Dec. 30, 2014 in the corresponding Korean Patent Application No. 10-2014-22537 (English Translation only).
(Continued)

*Primary Examiner* — Selim Ahmed
(74) *Attorney, Agent, or Firm* — Oblon, McClelland, Maier & Neustadt, L.L.P.

(57) ABSTRACT

A light-emitting device of an embodiment includes a light-emitting element emitting blue excitation light and a first phosphor excited by the blue excitation light and emitting fluorescence. A peak wavelength of the fluorescence is not shorter than 520 nm and shorter than 660 nm and the peak wavelength of the fluorescence shifting in the same direction when a peak wavelength of the blue excitation light shifts. The first phosphor is one of a yellow phosphor emitting yellow fluorescence, a green phosphor emitting green fluorescence, a yellow-green/yellow phosphor emitting yellow-green/yellow fluorescence and a red phosphor emitting red fluorescence.

13 Claims, 6 Drawing Sheets

(58) Field of Classification Search
USPC .......................................................... 257/98
See application file for complete search history.

(56) References Cited

U.S. PATENT DOCUMENTS

| | | |
|---|---|---|
| 2010/0102707 A1* | 4/2010 | Fukuda et al. ................ 313/503 |
| 2011/0084235 A1 | 4/2011 | Nagatomi et al. |
| 2012/0104317 A1 | 5/2012 | Nagatomi et al. |
| 2013/0026908 A1 | 1/2013 | Nagatomi et al. |
| 2013/0234584 A1 | 9/2013 | Hattori et al. |
| 2013/0241387 A1 | 9/2013 | Fukuda et al. |
| 2014/0084782 A1 | 3/2014 | Fukuda et al. |

FOREIGN PATENT DOCUMENTS

| | | |
|---|---|---|
| EP | 2 496 058 A2 | 9/2012 |
| EP | 2 597 129 A1 | 5/2013 |
| EP | 2 711 410 A1 | 3/2014 |
| JP | 2005-235847 | 9/2005 |
| JP | 2006-190813 | 7/2006 |
| JP | 2012-53378 | 3/2012 |
| JP | 2013-187485 | 9/2013 |
| KR | 10-2007-01 15951 | 12/2007 |
| WO | 2006/093298 | 9/2006 |

OTHER PUBLICATIONS

Extended European Search Report issued Oct. 9, 2014 in Patent Application No. 14155101.0.
Office Action issued on Jul. 9, 2015 in the corresponding Korean Patent Application No. 10-2014-0022537 (with English Translation).
Combined Taiwanese Office Action and Search Report issued Dec. 16, 2015 in Patent Application No. 103105106 (with English language translation and English translation of categories of cited documents).
Office Action issued Apr. 20, 2016 in European Patent Application No. 14 155 101.0-1551.
Office Action issued May 10, 2016 in Japanese Patent Application No. 2013-044914 with English language translation.
Office Action issued Mar. 18, 2016 in Korean Patent Application No. 10-2014-0022537 with English language translation.
Office Action issued May 16, 2016 in Korean Patent Application No. 10-2014-0022537 (with English-language translation).
Office Action issued Apr. 1, 2016, in Chinese Patent Application No. 201410075601.9.

* cited by examiner

LIGHT-EMITTING DEVICE WITH PHOSPHOR EXCITED BY BLUE EXCITATION LIGHT

CROSS-REFERENCE TO RELATED APPLICATION

This application is based upon and claims the benefit of priority from Japanese Patent Application No. 2013-044914, filed on Mar. 7, 2013, the entire contents of which are incorporated herein by reference.

FIELD

Embodiments described herein relate generally to a light-emitting device.

BACKGROUND

A light-emitting device using a light-emitting diode (LED) is composed principally of a combination of an LED chip as an excitation light source and a phosphor. Various emission colors may be realized by the combination.

The combination of a blue LED chip which emits blue light and the phosphor is used, for example, in a white LED light-emitting device which emits white light. A yellow phosphor complementary to blue color is principally used as the phosphor. In addition, a three wavelength type white LED formed of the combination of the blue LED chip which emits blue light, a green phosphor, and a red phosphor and the like is developed.

When a wavelength of the blue light being the excitation light source changes due to a temperature, a driving current amount, manufacturing variation and the like, balance of yellow light, green light, or red light emitted by the phosphors is lost and chromaticity change might occur. In this case, a problem of "color shift" that desired chromaticity cannot be obtained occurs.

Especially, in a light-adjusting light-emitting device in which intensity of the white light is changed by change in emission intensity of the blue LED, an emission wavelength of the blue LED changes due to change in driving current, so that the problem of "color shift" is remarkable.

DETAILED DESCRIPTION

A light-emitting device of an embodiment includes a light-emitting element emitting blue excitation light and a first phosphor excited by the blue excitation light and emitting fluorescence. A peak wavelength of the fluorescence is not shorter than 520 nm and shorter than 660 nm and the peak wavelength of the fluorescence shifting in the same direction when a peak wavelength of the blue excitation light shifts. The first phosphor is one of a yellow phosphor emitting yellow fluorescence, a green phosphor emitting green fluorescence, a yellow-green/yellow phosphor emitting yellow-green/yellow fluorescence and a red phosphor emitting red fluorescence.

In this specification, blue light is intended to mean light with a maximum peak wavelength not shorter than 420 nm and shorter than 480 nm. Green light is intended to mean light with a maximum peak wavelength not shorter than 480 nm and shorter than 550 nm. Yellow light is intended to mean light with a maximum peak wavelength not shorter than 550 nm and shorter than 600 nm. Red light is intended to mean light with a maximum peak wavelength not shorter than 600 nm and shorter than 760 nm. Meanwhile, green or yellow light in a boundary area between green and yellow is also referred to as yellow-green light. Yellow-green/yellow light is intended to mean light a the maximum peak wavelength not shorter than 520 nm and shorter than 600 nm.

In this specification the "wavelength-shifting phosphor" is intended to mean a phosphor in which the peak wavelength of the emitted fluorescence changes in accordance with change in the peak wavelength of the excitation light.

Embodiments are hereinafter described with reference to the drawings.

First Embodiment

A light-emitting device of this embodiment includes a light-emitting element emitting blue excitation light and a first phosphor excited by the blue excitation light and emitting fluorescence. A peak wavelength of the fluorescence is not shorter than 520 nm and shorter than 660 nm and the peak wavelength of the fluorescence shifting in the same direction when a peak wavelength of the blue excitation light shifts. The first phosphor is one of a yellow phosphor emitting yellow fluorescence, a green phosphor emitting green fluorescence, a yellow-green/yellow phosphor emitting yellow-green/yellow fluorescence and a red phosphor emitting red fluorescence.

Figure 1:
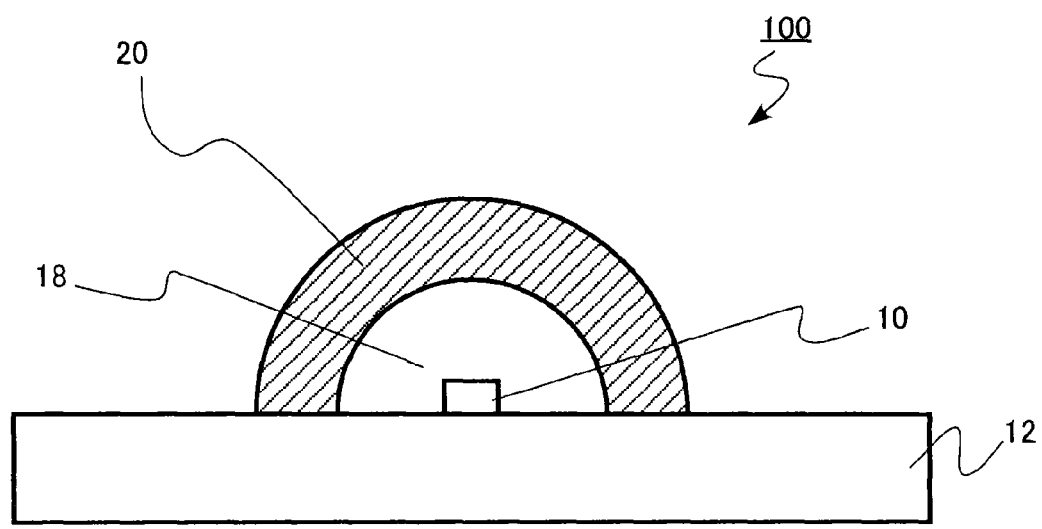
FIG. 1 is a schematic cross-sectional diagram of a light-emitting device of a first embodiment.

FIG. 1 is a schematic cross-sectional diagram of the light-emitting device of the embodiment. Hereinafter, a white light-emitting device in which the wavelength-shifting phosphor is a yellow phosphor and the blue excitation light emitted by the light-emitting element and a yellow fluorescence emitted by the yellow phosphor are mixed to emit day white color (color temperature of 5000 K) is described as an example.

A light-emitting device 100 is provided with a mounting substrate 12 having a planar surface on which a light-emitting element 10 is mounted.

A blue LED 10 is mounted on the planar surface of the mounting substrate 12, for example, as the light-emitting element 10 which emits light with the peak wavelength not shorter than 420 nm and not longer than 460 nm, for example.

The blue LED 10 is an AlGaInN-based LED having a GaInN light-emitting layer, for example.

An element sealing transparent layer 18 formed of a hemispherical transparent resin is provided on the light-emitting element 10. The transparent resin is a silicone resin, for example.

Further, a phosphor layer 20 having a semicircular outer peripheral shape in cross section perpendicular to the planar surface is formed so as to cover the element sealing transparent layer 18. The phosphor layer 20 includes a wavelength-shifting phosphor (first phosphor). The wavelength-shifting phosphor may be dispersed in a transparent resin. The wavelength-shifting phosphor may be one of the yellow phosphor excited by the excitation light being the blue light emitted by the light-emitting element 10 to emit the yellow fluorescence, the green phosphor excited by the blue light to emit the green fluorescence, and the red phosphor excited by the blue light to emit the red fluorescence, with the peak wavelength of the fluorescence not shorter than 520 nm and shorter than 660 nm, the peak wavelength of the fluorescence shifting in the same direction when the peak wavelength of the excitation light shifts.

The wavelength-shifting phosphor included in the phosphor layer 20 has the peak wavelength of the fluorescence not shorter than 520 nm and shorter than 660 nm. The peak wavelength of the fluorescence of which shifts in the same direction when the peak wavelength of the blue excitation light shifts. Since the peak wavelength shifts in the same direction as the peak wavelength of the excitation light, it becomes possible to realize the light-emitting device with small chromaticity change even when an emission wavelength of the blue excitation light changes.

For example, the wavelength-shifting phosphor is a yellow-green/yellow phosphor which emits yellow-green/yellow fluorescence with the peak wavelength not shorter than 520 nm and shorter than 600 nm.

Yellow-green/yellow phosphor particles are dispersed in a transparent silicone resin, for example, to form the phosphor layer 20. The phosphor layer 20 absorbs the blue light emitted by the blue LED and converts the blue light to yellow-green/yellow light.

The peak wavelength of the fluorescence emitted by the phosphor may be measured with a spectrophotometer, for example. It becomes possible to find a shift direction of the peak wavelength of the fluorescence by measuring the peak wavelength of the fluorescence while shifting the peak wavelength of the excitation light applied to the phosphor.

Figure 2:
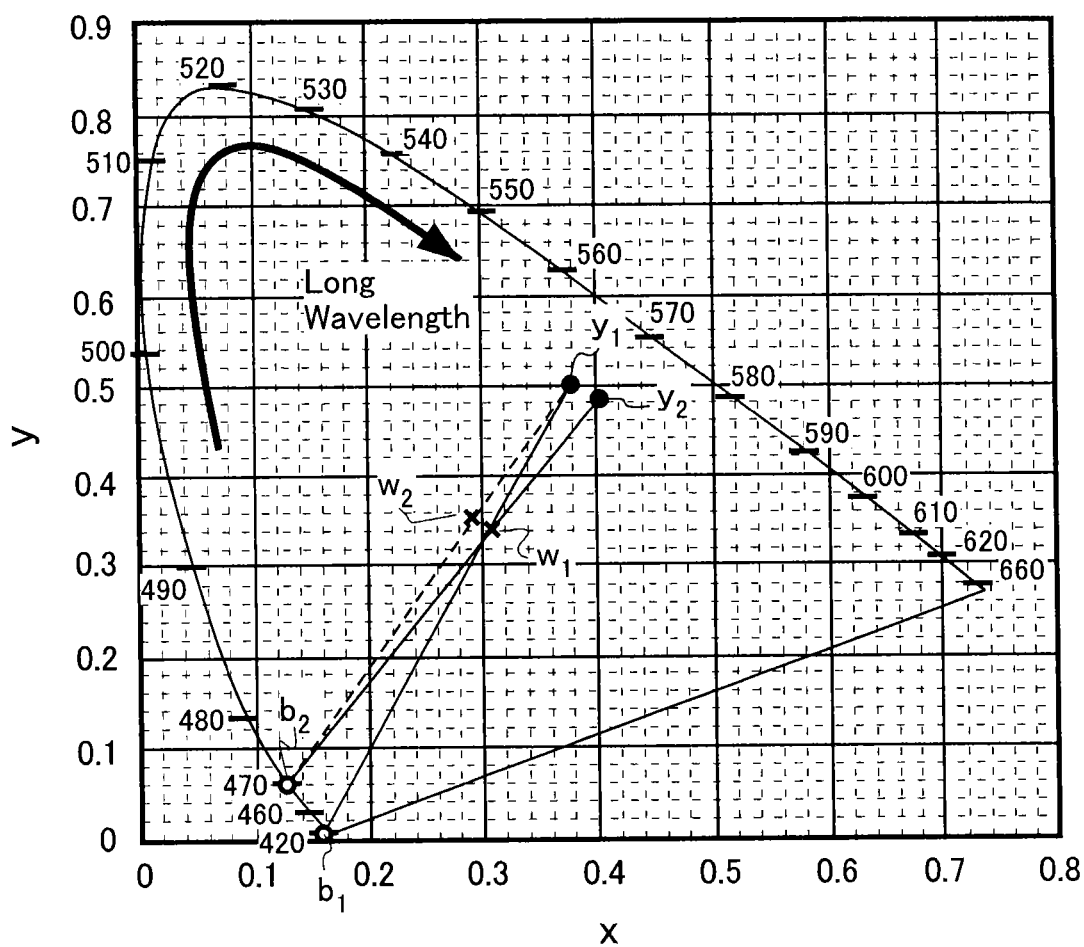
FIG. 2 is a view illustrating an action and an effect of the first embodiment.

FIG. 2 is a view illustrating a function and an effect of this embodiment. FIG. 2 is a CIE chromaticity diagram. Numerical values in the drawing indicate wavelengths of light.

For example, suppose that the white light-emitting device includes a combination of the blue LED which emits the excitation light with the peak wavelength of 420 nm and chromaticity of "b1" in the drawing and the yellow-green/yellow phosphor with the peak wavelength of the fluorescence excited by the blue LED of 565 nm and the chromaticity of "y1" in the drawing. The chromaticity of white color emitted by the white light-emitting device is on a first line segment connecting "b1" and "y1" and is "w1" in the drawing, for example.

Suppose that the peak wavelength of the excitation light of the blue LED shifts to a long-wavelength side from 420 nm to 470 nm and the chromaticity thereof becomes "b2" in the drawing. Then, the chromaticity of the light emitted by the white light-emitting device is on a second line segment connecting "b2" and "y1" (indicated by a dotted line in the drawing) and the chromaticity changes to "w2" in the drawing, for example; that is to say, a color shift problematically occurs.

The peak wavelength of the excitation light of the blue LED shifts due to increase in temperature of the blue LED, for example. Alternatively, this shifts due to manufacturing variation of the blue LED, for example.

In this embodiment, the wavelength-shifting phosphor, the peak wavelength of the fluorescence of which shifts in the same direction when the peak wavelength of the excitation light shifts, is applied as the yellow-green/yellow phosphor. Herein, to shift in "the same direction" is intended to mean that the peak wavelength of the fluorescence of the phosphor shifts to the long-wavelength side when the peak wavelength of the excitation light of the blue LED shifts to the long-wavelength side, and that the peak wavelength of the fluorescence shifts to a short-wavelength side when the peak wavelength of the excitation light of the blue LED shifts to the short-wavelength side.

For example, when the peak wavelength of the excitation light of the blue LED shifts to the long-wavelength side and the chromaticity of the excitation light changes from "b1" to "b2" in the drawing, the fluorescence of the yellow-green/yellow phosphor also shifts to the long-wavelength side such as 570 nm, and the chromaticity of the fluorescence changes from "y1" to "y2" in the drawing. In this case, the chromaticity of the white color emitted by the white light-emitting device is on a second line segment connecting "b2" and "y2" and the chromaticity approaches "w1" before the shift of the excitation light. Therefore, the problem of color shift is inhibited.

In this manner, the peak wavelength of the wavelength-shifting phosphor shifts in the same direction as the shift of the peak wavelength of the excitation light in this embodiment. According to this, the chromaticity change due to the shift of the peak wavelength of the excitation light is compensated and the chromaticity change may be inhibited. Therefore, it becomes possible to realize the light-emitting device with small chromaticity change even when the peak wavelength of the excitation light shifts.

Meanwhile, the excitation light and the fluorescence are selected such that there is an intersection point of the first line segment connecting a point on the chromaticity diagram of the excitation light and a point on the chromaticity diagram of the fluorescence before the shift of the peak wavelength of the excitation light and the second line segment connecting a point on the chromaticity diagram of the excitation light and a point on the chromaticity diagram of the fluorescence after the shift of the peak wavelength of the excitation light. In other word, the light-emitting element and the phosphor are selected such that there is the intersection point. According to this, it becomes possible to inhibit the color shift problem.

Meanwhile, the peak wavelength of the fluorescence of the wavelength-shifting phosphor of this embodiment is not shorter than 520 nm and shorter than 660 nm. As is clear from the chromaticity diagram in FIG. 2, the chromaticity does not change in a direction to compensate the chromaticity change in the excitation light even when the peak wavelength of the fluorescence becomes longer under this range. Also, the chromaticity change is small and a compensation effect of the chromaticity change cannot be sufficiently obtained even when the peak wavelength of the fluorescence becomes longer above this range.

The peak wavelength of the fluorescence of the wavelength-shifting phosphor desirably shifts by 20 nm or more when the peak wavelength of the blue light being the excitation light shifts from 420 nm to 460 nm. This is because, with the shift by 20 nm or more, it is possible to sufficiently compensate the chromaticity change in the excitation light even when this is large. Meanwhile, an upper limit of a shift amount of the peak wavelength is desirably not more than 50 nm. This is because there is concern about the color shift due to a too large shift of the peak wavelength of the fluorescence above this range.

The yellow-green/yellow phosphor is desirably the yellow-green/yellow phosphor represented by following general equation (1). This phosphor is a so-called sialon (SiAlON) phosphor containing silicon (Si), aluminum (Al), oxygen (O), and nitrogen (N).

$$(Sr_{1-x1}Ce_{x1})_{a1}AlSi_{b1}O_{c1}N_{d1} \quad (1)$$

Meanwhile, in general equation (1) described above, x1, a1, b1, c1, and d1 satisfy following relationships. $0<x1<1$, $0.6<a1<0.95$, $2.0<b1<3.9$, $0<c1<0.45$, $4.0<d1<5.0$.

The yellow-green/yellow phosphor represented by general equation (1) described above is a desirable phosphor because of a large change amount of the peak wavelength of the fluorescence when the peak wavelength of the blue excitation light changes. According to the yellow-green/yellow phosphor represented by general equation (1) described above, it is also possible to shift the peak wavelength of the fluorescence by 20 nm or more when the peak wavelength of the blue light being the excitation light shifts from 420 nm to 460 nm.

Figure 3:
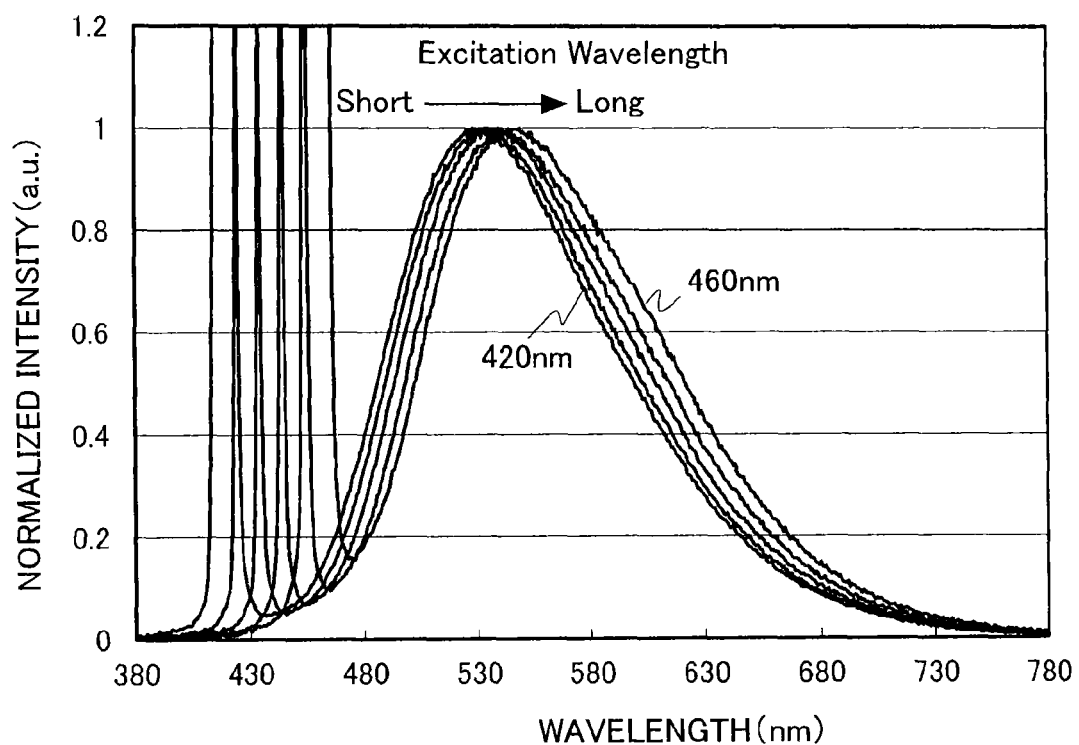
FIG. 3 is a view illustrating a wavelength shift amount of a yellow phosphor of the first embodiment.

FIG. 3 is a view illustrating a wavelength shift amount of the yellow-green/yellow phosphor represented by general equation (1) described above. The wavelength and normalized light intensity are plotted along the abscissa and the ordinate. An intensity profile of the fluorescence when the peak wavelength of the blue light being the excitation light is changed from 420 nm to 460 nm at 10 nm intervals is illustrated.

As is clear from FIG. 3, the peak wavelength of the excited fluorescence of the yellow-green/yellow phosphor becomes longer as the peak wavelength of the excitation light becomes longer. The peak wavelength of the fluorescence is 528 nm when the peak wavelength of the excitation light is 420 nm and 550 nm when this is 460 nm. Therefore, the peak wavelength of the fluorescence of the wavelength-shifting phosphor shifts by 20 nm or more when the peak wavelength of the blue light being the excitation light shifts from 420 nm to 460 nm.

Meanwhile, a case in which the yellow-green/yellow phosphor is used as the wavelength-shifting phosphor is described as an example in this embodiment. However, the wavelength-shifting phosphor is not limited to the yellow-green/yellow phosphor. For example, it is also possible to use the green phosphor or the red phosphor as the wavelength-shifting phosphor. It is also possible to combine a plurality of types of wavelength-shifting phosphors.

It is also possible to add the green phosphor or the red phosphor which emits another color to the yellow-green/yellow phosphor of the wavelength-shifting phosphor in this embodiment. According to this, it becomes possible to adjust the chromaticity of the light-emitting device 100.

The green phosphor (second phosphor) represented by following general equation (2) is desirably added as the green phosphor. The phosphor is the so-called sialon phosphor.

$$(Sr_{1-x2}Eu_{x2})_{a2}AlSi_{b2}O_{c2}N_{d2} \quad (2)$$

Meanwhile, in general equation (2) described above, x2, a2, b2, c2, and d2 satisfy following relationships. $0<x2<1$, $0.93<a2<1.3$, $4.0<b2<5.8$, $0.6<c2<1.0$, $6.0<d2<11$.

The red phosphor (third phosphor) represented by following general equation (3) is desirably added as the red phosphor. The phosphor is the so-called sialon phosphor.

$$(Sr_{1-x3}Eu_{x3})_{a3}AlSi_{b3}O_{c3}N_{d3} \quad (3)$$

Meanwhile, in general equation (3) described above, x3, a3, b3, c3, and d3 satisfy following relationships. $0<x3<1$, $0.6<a3<0.95$, $2.0<b3<3.9$, $0.25<c3<0.45$, $4.0<d3<5.0$.

Especially, when the sialon green phosphor or the sialon red phosphor is added to the sialon yellow-green/yellow phosphor in the same phosphor layer 20, phosphor particles have similar particle diameters and shapes, so that dispersibility of the particles at the time of manufacture of the phosphor layer is improved. Therefore, the phosphor particles are uniformly distributed in the phosphor layer 20. Therefore, it becomes possible to realize the light-emitting device with uniform emission intensity and chromaticity distribution.

Second Embodiment

A light-emitting device of this embodiment includes a light-emitting element emitting blue excitation light and a first phosphor excited by the blue excitation light and emitting fluorescence. A peak wavelength of the fluorescence is not shorter than 520 nm and shorter than 660 nm and the peak wavelength of the fluorescence shifting in the same direction when a peak wavelength of the blue excitation light shifts. The first phosphor is one of a yellow phosphor emitting yellow fluorescence, a green phosphor emitting green fluorescence, a yellow-green/yellow phosphor emitting yellow-green/yellow fluorescence and a red phosphor emitting red fluorescence. In addition, the light-emitting device of this embodiment includes a light-adjusting mechanism to change emission intensity of the light-emitting element.

The light-emitting device of this embodiment is similar to that of the first embodiment except that the light-adjusting mechanism is provided. Therefore, description of contents overlapped with those of the first embodiment is not repeated.

Figure 4:
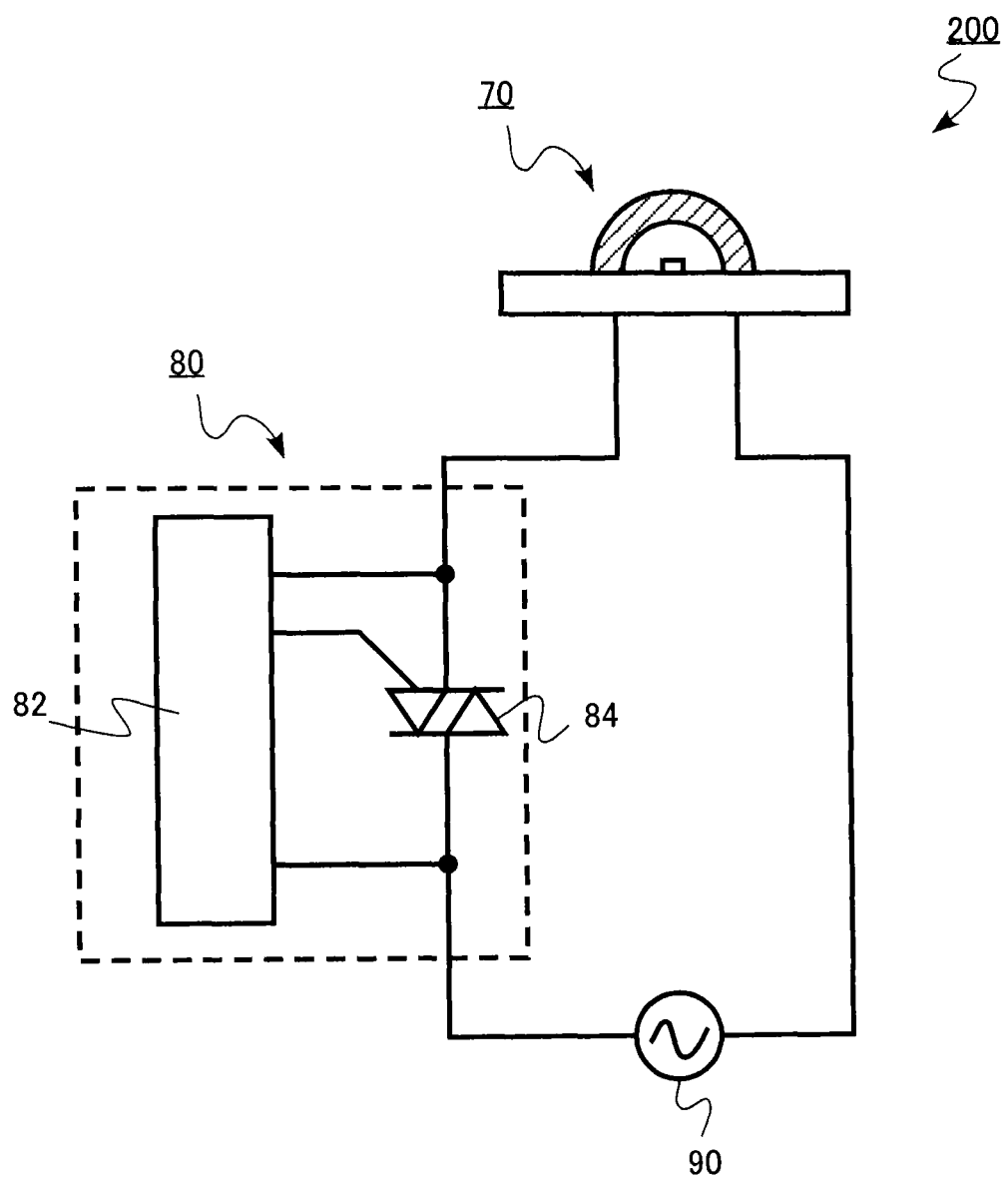
FIG. 4 is a schematic diagram of a circuit configuration of a light-emitting device of a second embodiment.

FIG. 4 is a schematic diagram illustrating a circuit configuration of the light-emitting device of the embodiment. A white light-emitting device in which the blue excitation light emitted by the light-emitting element and the yellow fluorescence emitted by a yellow-green/yellow phosphor are mixed to emit day white color (color temperature of 5000 K) is described as an example.

A light-emitting device 200 of this embodiment is provided with a light-emitting unit 70 and a light-adjusting mechanism 80 electrically connected to the light-emitting unit 70. The light-adjusting mechanism 80 is inserted between the light-emitting unit 70 and a power supply 90. Meanwhile, the light-emitting unit 70 has a configuration similar to that of the light-emitting device 100 of the first embodiment.

The light-adjusting mechanism 80 has a function to change the emission intensity of the light-emitting unit 70 to desired intensity. The light-adjusting mechanism 80 is provided with a control circuit 82 and a bidirectional thyristor 84. The light-emitting device 200 is the light-emitting device which adjusts light by amplitude control.

For example, a timer value in the control circuit 82 is set by a light-adjusting knob not illustrated to change timing to turn on the bidirectional thyristor. According to this, a current value input to a blue LED of the light-emitting unit 70 by the control circuit 82 changes depending on a changing power supply waveform. Therefore, intensity of the excitation light emitted by the blue LED of the light-emitting unit 70 changes and the intensity of the fluorescence emitted by the phosphor of the light-emitting unit 70 also changes along with this. Therefore, the emission intensity of the light-emitting unit 70 is changed to the desired intensity.

When the current value input to the blue LED changes, the peak wavelength of the excitation light emitted by the blue LED might significantly shift. According to this embodiment, even when the peak wavelength of the excitation light emitted by the blue LED significantly shifts, the peak wavelength of the fluorescence emitted by the wavelength-shifting phosphor shifts in the same direction as the peak wavelength of the excitation light. Therefore, chromaticity change by the shift of the peak wavelength of the excitation light emitted by the blue LED is compensated and the light-emitting device with small chromaticity shift is realized.

EXAMPLE

Example

A sialon phosphor $(Sr_{0.98}Ce_{0.02})_2Al_3Si_7O_1N_{13}$ was used as a yellow-green/yellow phosphor and a sialon phosphor $(Sr_{0.98}Eu_{0.02})_2Al_3Si_7O_1N_{13}$ was used as a red phosphor, and mixture of them at a weight ratio of 5:1 was dispersed in a resin. The resin in which the yellow-green/yellow phosphor and the red phosphor were dispersed was applied on a sapphire substrate and this was put in a 150° C.-environment for 30 minutes for hardening the resin. In this manner, a phosphor layer was formed on the substrate. An application amount of the resin was adjusted to adjust chromaticity, and a light-emitting device which generates white light was obtained.

Meanwhile, the sialon phosphor $(Sr_{0.98}Ce_{0.02})_2Al_3Si_7O_1N_{13}$ has a peak wavelength of fluorescence not shorter than 520 nm and shorter than 600 nm and the peak wavelength of the fluorescence shifts in the same direction when the peak wavelength of excitation light shifts.

Figure 5:
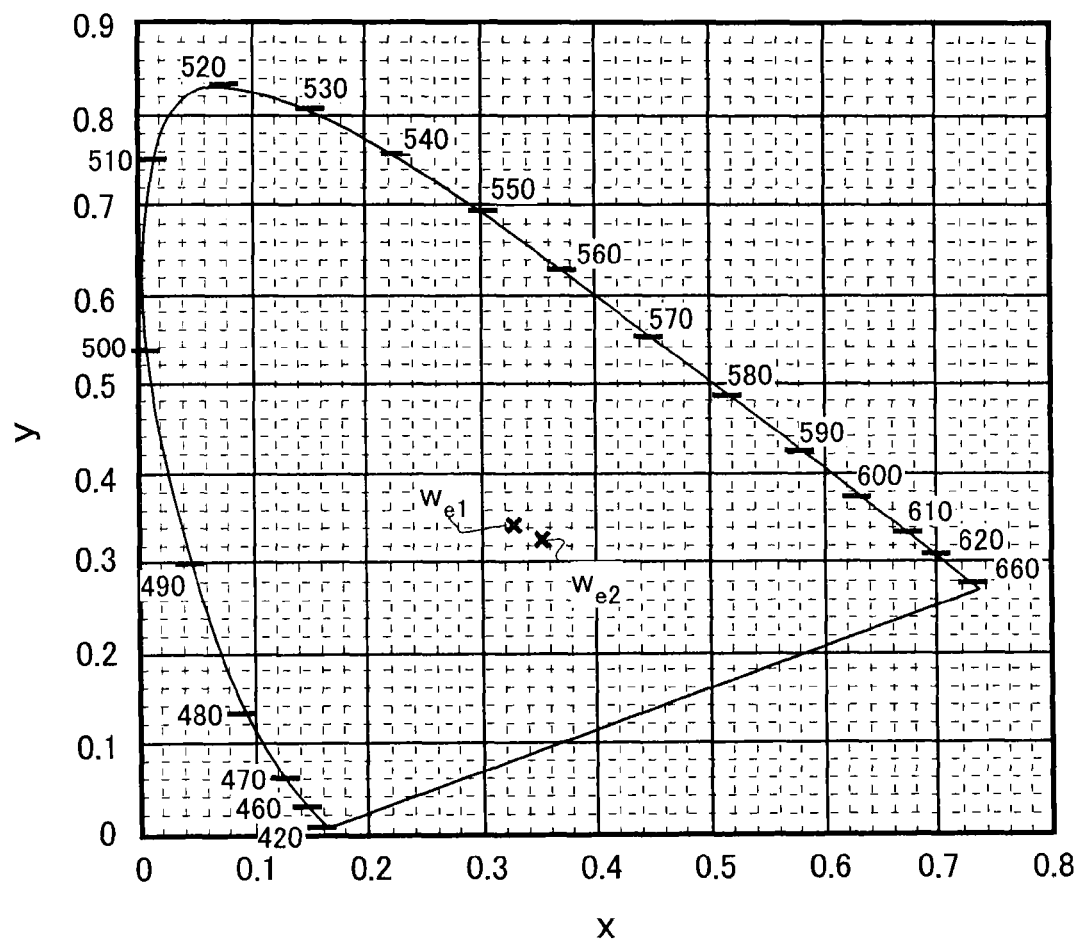
FIG. 5 is a view illustrating chromaticity change of a light-emitting device of an example.

FIG. 5 is a view illustrating chromaticity change of the light-emitting device of an example. Chromaticity when the peak wavelength of the blue LED is 430 nm and the chromaticity when this is 450 nm were compared. The chromaticity in the case of 430 nm was "$W_{e1}$" in the drawing and that in the case of 450 nm was "$W_{e2}$" in the drawing. Difference in chromaticity was 0.02 for Cx and 0.02 for Cy.

Comparative Example

A light-emitting device similar to that of the example except that YAG:Ce is used as a yellow phosphor was manufactured. Meanwhile, with YAG:Ce, a shift of a peak wavelength of fluorescence is scarcely confirmed in regard to the shift of the peak wavelength of excitation light.

Figure 6:
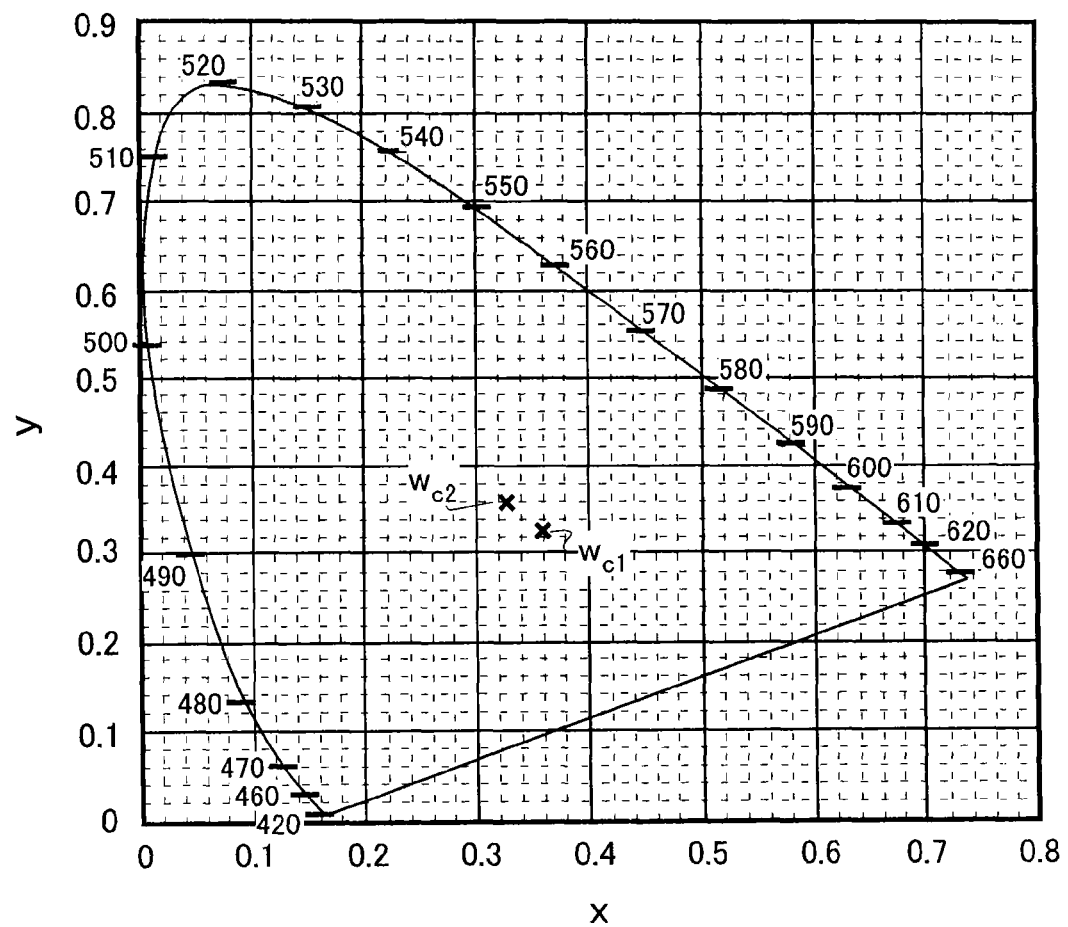
FIG. 6 is a view illustrating chromaticity change of a light-emitting device of a comparative example.

FIG. 6 is a view illustrating chromaticity change of the light-emitting device of a comparative example. Chromaticity when the peak wavelength of a blue LED is 430 nm and the chromaticity when this is 450 nm were compared. The chromaticity in the case of 430 nm was "$W_{c1}$" in the drawing, and that in the case of 450 nm was "$W_{c2}$" in the drawing. Difference in chromaticity was 0.02 for Cx and 0.03 for Cy.

An effect of the present disclosure to inhibit the color shift is confirmed by comparison between the example and the comparative example.

The white light-emitting device is described as an example in the above-described embodiment. Especially, the present disclosure is effective in the white light-emitting device in which the chromaticity of the emitted light sensitively responds to the chromaticity change in the blue excitation light. However, application of the present disclosure is not limited to the white light-emitting device and this may also be applied to a green light-emitting device and a red light-emitting device, for example.

Although a single-layer phosphor layer is described in the above-described embodiment, a structure in which a plurality of phosphor layers is laminated is also possible.

Although the silicone resin is described as an example of a transparent base material of the phosphor layer, any material having high excitation light permeability and high heat resistance may be used. As such material, an epoxy resin, an urea resin, a fluorine resin, an acrylic resin, a polyimide resin and the like may be used in addition to the silicone resin, for example. Especially, the epoxy resin and the silicone resin are preferably used because of ease of purchase and handling and a low cost thereof. Also, glass, a sintered body and the like may be used in addition to the resin.

While certain embodiments have been described, these embodiments have been presented by way of example only, and are not intended to limit the scope of the inventions. Indeed, the light-emitting device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A light-emitting device, comprising:
a light-emitting element emitting blue excitation light; and
a first phosphor excited by the blue excitation light and emitting fluorescence, a peak wavelength of the fluorescence being not shorter than 520 nm and shorter than 660 nm, an x coordinate of chromaticity of the fluorescence being increased and a y coordinate of chromaticity of the fluorescence being decreased when an x coordinate of chromaticity of the blue excitation light being decreased and a y coordinate of chromaticity of the blue excitation light being increased, the first phosphor being one of a yellow phosphor emitting yellow fluorescence, a green phosphor emitting green fluorescence, a yellow-green/yellow phosphor emitting yellow-green/yellow fluorescence and a red phosphor emitting red fluorescence.

2. The device according to claim 1, wherein the first phosphor is the yellow-green/yellow phosphor.

3. The device according to claim 1, wherein the first phosphor is the yellow-green/yellow phosphor represented by general equation (1), where x1, a1, b1, c1, and d1 satisfy relationships of $0<x1<1$, $0.6<a1<0.95$, $2.0<b1<3.9$, $0<c1<0.45$, and $4.0<d1<5.0$, respectively $$(Sr_{1-x1}Ce_{x1})_{a1}AlSi_{b1}O_{c1}N_{d1} \qquad (1).$$

4. The device according to claim 3, further comprising a second phosphor being a green phosphor represented by general expression (2), where x2, a2, b2, c2, and d2 satisfy relationships of $0<x2<1$, $0.93<a2<1.3$, $4.0<b2<5.8$, $0.6<c2<1.0$, and $6.0<d2<11$, respectively $$(Sr_{1-x2}Eu_{x2})_{a2}AlSi_{b2}O_{c2}N_{d2} \qquad (2).$$

5. The device according to claim 4, further comprising a third phosphor bring a red phosphor represented by general expression (3), where x3, a3, b3, c3, and d3 satisfy relationships of $0<x3<1$, $0.6<a3<0.95$, $2.0<b3<3.9$, $0.25<c3<0.45$, and $4.0<d3<5.0$, respectively $$(Sr_{1-x3}Eu_{x3})_{a3}AlSi_{b3}O_{c3}N_{d3} \qquad (3).$$

6. The device according to claim 1, further comprising a light-adjusting mechanism changing emission intensity of the light-emitting element.

7. A light-emitting device, comprising:
a light-emitting element emitting blue excitation light; and
a first phosphor excited by the blue excitation light and emitting fluorescence, a peak wavelength of the fluorescence being not shorter than 520 nm and shorter than 660 nm, an x coordinate of chromaticity of the fluorescence being increased and a y coordinate of chromaticity of the fluorescence being decreased when a peak wavelength of the blue excitation light shifts to a longer wavelength, the first phosphor being one of a yellow phosphor emitting yellow fluorescence, a green phosphor emitting green fluorescence, a yellow-green/yellow phosphor emitting yellow-green/yellow fluorescence and a red phosphor emitting red fluorescence.

8. The device according to claim 7, wherein the first phosphor is the yellow-green/yellow phosphor.

9. The device according to claim 7, wherein the peak wavelength of the fluorescence of the first phosphor shifts by 20 nm or more when the peak wavelength of the blue excitation light shifts from 420 nm to 460 nm.

10. The device according to claim 7, wherein the first phosphor is a yellow-green/yellow phosphor represented by general equation (1), where x1, a1, b1, c1, and d1 satisfy relationships of $0<x1<1$, $0.6<a1<0.95$, $2.0<b1<3.9$, $0<c1<0.45$, and $4.0<d1<5.0$, respectively $$(Sr_{1-x1}Ce_{x1})_{a1}AlSi_{b1}O_{c1}N_{d1} \qquad (1).$$

11. The device according to claim 10, further comprising a second phosphor being a green phosphor represented by general expression (2), where x2, a2, b2, c2, and d2 satisfy relationships of $0<x2<1$, $0.93<a2<1.3$, $4.0<b2<5.8$, $0.6<c2<1.0$, and $6.0<d2<11$, respectively $$(Sr_{1-x2}Eu_{x2})_{a2}AlSi_{b2}O_{c2}N_{d2} \qquad (2).$$

12. The device according to claim 11, further comprising a third phosphor bring a red phosphor represented by general expression (3), where x3, a3, b3, c3, and d3 satisfy relationships of $0<x3<1$, $0.6<a3<0.95$, $2.0<b3<3.9$, $0.25<c3<0.45$, and $4.0<d3<5.0$, respectively $$(Sr_{1-x3}Eu_{x3})_{a3}AlSi_{b3}O_{c3}N_{d3} \qquad (3).$$

13. The device according to claim 7, further comprising:
a light-adjusting mechanism configured to change emission intensity of the light-emitting element.

* * * * *